(12) United States Patent
Kuwabara (10) Patent No.: US 8,741,741 B2
(45) Date of Patent: Jun. 3, 2014

(54) METHOD FOR DESIGNING SOI WAFER AND METHOD FOR MANUFACTURING SOI WAFER

(75) Inventor: Susumu Kuwabara, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/576,889

(22) PCT Filed: Feb. 3, 2011

(86) PCT No.: PCT/JP2011/000598
§ 371 (c)(1),
(2), (4) Date: Aug. 2, 2012

(87) PCT Pub. No.: WO2011/108188
PCT Pub. Date: Sep. 9, 2011

(65) Prior Publication Data
US 2012/0295424 A1  Nov. 22, 2012

(30) Foreign Application Priority Data

Mar. 4, 2010  (JP) .................................. 2010-47885

(51) Int. Cl.
*H01L 21/30*  (2006.01)
*H01L 21/46*  (2006.01)

(52) U.S. Cl.
USPC ............ 438/458; 257/E21.568; 257/E21.599; 438/404; 438/455; 438/459

(58) Field of Classification Search
USPC ........... 257/E21.568, E21.599; 438/404, 455, 438/458, 459
See application file for complete search history.

(56) References Cited

U.S. PATENT DOCUMENTS

| 5,374,564 | A | 12/1994 | Bruel |
| 5,952,694 | A | 9/1999 | Miyawaki et al. |
| 6,428,894 | B1 | 8/2002 | Babich et al. |

(Continued)

FOREIGN PATENT DOCUMENTS

| EP | 1 016 930 A1 | 7/2000 |
| EP | 1 806 769 A1 | 7/2007 |

(Continued)

OTHER PUBLICATIONS

International Search Report issued in International Application No. PCT/JP2011/000598 dated Mar. 29, 2011.

(Continued)

*Primary Examiner* — Asok K Sarkar
(74) *Attorney, Agent, or Firm* — Oliff PLC (57) ABSTRACT

A method for manufacturing an SOI wafer that has an SOI layer formed on a buried insulator layer and is suitable for photolithography with an exposure light having a wavelength λ comprises: designing a thickness of the buried insulator layer of the SOI wafer on the basis of the wavelength λ of the exposure light utilized for the photolithography that is to be performed on the SOI wafer after manufacturing; and fabricating the SOI wafer that has the SOI layer formed on the buried insulator layer having the designed thickness. As a result, there is provided a method for designing an SOI wafer and a method for manufacturing an SOI wafer that enable the variation in the reflection rate of the exposure light due to the variation in the SOI layer thickness and hence variation in the exposure state of a resist to be inhibited in a photolithography operation.

4 Claims, 5 Drawing Sheets

(56) References Cited

U.S. PATENT DOCUMENTS

| | | |
|---|---|---|
| 2002/0173084 A1 | 11/2002 | Ohkawa |
| 2005/0048222 A1 | 3/2005 | Ruelke et al. |
| 2008/0128851 A1 | 6/2008 | Aga et al. |
| 2010/0120223 A1* | 5/2010 | Kobayashi et al. ........... 438/458 |

FOREIGN PATENT DOCUMENTS

| | | |
|---|---|---|
| JP | A-05-211128 | 8/1993 |
| JP | A-05-275665 | 10/1993 |
| JP | A-2000-195791 | 7/2000 |
| JP | A-2002-343842 | 11/2002 |
| JP | A-2006-080461 | 3/2006 |
| JP | A-2007-521660 | 8/2007 |
| WO | WO 2005/024922 A1 | 3/2005 |
| WO | WO 2006/085626 A1 | 8/2006 |

OTHER PUBLICATIONS

Nov. 6, 2013 European Search Report issued in European Patent Application No. 11750302.9.

* cited by examiner

METHOD FOR DESIGNING SOI WAFER AND METHOD FOR MANUFACTURING SOI WAFER

TECHNICAL FIELD

The present invention relates to a method for designing and manufacturing an SOI wafer having an SOI layer formed on a buried insulator layer, and more particularly to a method for designing and manufacturing an SOI wafer suitable for photolithography that is to be performed after manufacturing.

BACKGROUND ART

In recent years, SOI wafers have been used in device fabrication as semiconductor substrates having a multilayer film structure. For example, various devices, such as CPUs, logics, memories, physical sensors related to MEMS (Micro-Electro-Mechanical-Systems), biosensors, and RF devices, are fabricated by using SOI wafers.

As methods for fabricating the SOI wafers, wafer bonding methods and a SIMOX method are generally known. An ion implantation delamination method (also referred to as the SMART-CUT (a registered trademark) method), which is one of the wafer bonding methods, is proposed in Patent Document 1. In this method, an oxide film is formed on at least one of two silicon wafers, at least one of hydrogen ions and rare gas ions are implanted into a main surface of one of the wafers (a bond wafer) to form an ion-implanted layer in the interior of the wafer. The ion-implanted surface is then brought into close contact with a main surface of the other silicon wafer through the oxide film and the resultant wafer is then delaminated at the ion-implanted layer by performing a heat treatment at a temperature in the range of 300° C. to 600° C., or more than that. The ion implantation delamination method has an advantage in that an SOI wafer having a thin SOI layer with a film thickness uniformity of ±10 nm or less can be readily fabricated and an advantage in that the delaminated bond wafer can be reused several times to reduce cost.

On the other hand, in the SIMOX method, high concentration oxygen ions are implanted into the interior of a silicon wafer to form an oxygen ion-implanted layer, a buried oxide film (a BOX layer) is then formed in the silicon wafer by performing an annealing process at a high temperature of approximately 1300° C., and a layer of its surface side is used as the SOI layer.

A device pattern is then formed on the SOI wafer fabricated in the above manner. In this case, the feature size of pattern exhibits a wide range of pattern sizes from a relatively large size pattern for used in MEMS, RF devices and the like to a fine pattern for used in the latest CPUs, logics, memories and the like that have been significantly shrunken. Photolithography, which is one of the most important processes used for pattern formation in manufacture of various devices, has been used to form device patterns of various design rules.

In accordance with the feature size and so on, a wavelength from a visible light region to a deep ultraviolet light (DUV) region is used as the wavelength of an exposure light utilized for a photolithography operation. More specifically, the exposure light wavelength used herein is changed according to the design rules and so on. For example, in the case of formation of a relatively large size pattern such as the above mentioned MEMS, a mercury lamp having a wavelength of 436 nm or 365 nm is used. An excimer laser having a wavelength of 248 nm or 193 nm is used for the latest CPUs, logics, and memories, for example. It can be thought that an extreme ultraviolet light (EUV) having a wavelength of 13.5 nm will be used as the exposure light in future.

For the purpose of improving line width uniformity of an image of the pattern exposed to a light on the wafer, Patent Document 2 discloses an exposing device that is provided with a digital micro device as a reflection element array including a plurality of mirror elements that are each operable to control the reflection direction of an illumination light and controlling illumination distribution by adjusting reflection angles of the mirror elements separately from each other. Patent Document 2 also discloses use of an exposure light wavelength of 248 nm or 193 nm and use of the SOI wafer as a wafer subjected to photolithography.

CITATION LIST

Patent Literature

Patent Document 1: Japanese Unexamined Patent publication (Kokai) No. H05-211128
Patent Document 2: Pamphlet of International Publication. No. WO2006/085626

SUMMARY OF INVENTION

In the above-described photolithography operation in a device manufacturing process, there has been a problem in that the reflection rate of the exposure light varies widely due to variation in the SOI layer thickness in a plane of the SOI wafer and the intensity of exposure to a resist thereby varies so that unevenness of exposure is created. As a result, pattern blurring and pattern shift are created in a developed pattern, thereby resulting in a difference in the developed pattern from the corresponding designed pattern. A difference from design may also be created in pattern formation of the SOI wafer, which is performed by subsequent steps such as etching, film formation, and ion implantation, thereby resulting in variation in device electric characteristics.

The present invention was accomplished in view of the above-described problems, and its object is to provide a method for designing an SOI wafer and a method for manufacturing an SOI wafer that enable the variation in the reflection rate of the exposure light due to the variation in the SOI layer thickness of the SOI wafer and hence variation in the exposure state of a resist to be inhibited in a photolithography operation.

To achieve this object, the present invention provides a method for designing an SOI wafer that has an SOI layer formed on a buried insulator layer and is suitable for photolithography with an exposure light having a wavelength $\lambda$, the method comprising designing a thickness of the buried insulator layer of the SOI wafer on the basis of the wavelength $\lambda$ of the exposure light.

When the thickness of the buried insulator layer of the SOI wafer is designed on the basis of the wavelength $\lambda$ of the exposure light as above, an SOI wafer can be designed which enables inhibition of the variation in the reflection rate of the exposure light due to the variation in the SOI layer thickness and hence inhibition of the variation in the exposure state of the resist when the photolithography operation is performed on the SOI wafer and enables pattern formation with high precision.

In this method, the thickness of the buried insulator layer of the SOI wafer can be designed as a thickness d satisfying an expression $d=(1/2)\times(\lambda/n)\times A$, wherein d represents the thickness of the buried insulator layer, n represents a refractive index of the buried insulator layer, and A represents an arbitrary positive integer.

When the thickness of the buried insulator layer of the SOI wafer is designed as a thickness d satisfying an expression $d=(1/2)\times(\lambda/n)\times A$, wherein d represents the thickness of the buried insulator layer, n represents a refractive index of the buried insulator layer, and A represents an arbitrary positive integer as above, the thickness of the buried insulator layer of the SOI wafer can be concretely designed on the basis of the wavelength $\lambda$ of the exposure light utilized for the photolithography operation, and the SOI wafer can be designed which enables inhibition of the variation in the reflection rate of the exposure light due to the variation in the SOI layer thickness and hence inhibition of the variation in the exposure state of the resist when the photolithography operation is performed on the SOI wafer.

In the method, the buried insulator layer can be any one of a silicon oxide film, a silicon nitride film, and a silicon oxynitride film, or a laminated insulator layer formed as a multilayer thereof.

Even when various insulator films, such as any one of a silicon oxide film, a silicon nitride film, and a silicon oxynitride film, or a laminated insulator layer formed as a multilayer thereof, are used as the buried insulator layer, the SOI wafer can be designed which enables inhibition of the variation in the reflection rate of the exposure light due to the variation in the SOI layer thickness and hence inhibition of the variation in the exposure state of the resist in the photolithography operation in accordance with the present invention.

Furthermore, the present invention provides a method for manufacturing an SOI wafer that has an SOI layer formed on a buried insulator layer and is suitable for photolithography with an exposure light having a wavelength $\lambda$, the method comprising the steps of: designing a thickness of the buried insulator layer of the SOI wafer on the basis of the wavelength $\lambda$ of the exposure light utilized for the photolithography that is to be performed on the SOI wafer after manufacturing; and fabricating the SOI wafer that has the SOI layer formed on the buried insulator layer having the designed thickness.

With the manufacturing method including the steps of: designing a thickness of the buried insulator layer of the SOI wafer on the basis of the wavelength $\lambda$ of the exposure light utilized for the photolithography that is to be performed on the SOI wafer after manufacturing; and fabricating the SOI wafer that has the SOI layer formed on the buried insulator layer having the designed thickness as above, the SOI wafer can be manufactured which enables inhibition of the variation in the reflection rate of the exposure light due to the variation in the SOI layer thickness and hence inhibition of the variation in the exposure state of the resist when the photolithography operation is performed on the SOI wafer and enables pattern formation with high precision.

In the manufacturing method, the thickness of the buried insulator layer of the SOI wafer can be designed as a thickness d satisfying an expression $d=(1/2)\times(\lambda/n)\times A$, wherein d represents the thickness of the buried insulator layer, n represents a refractive index of the buried insulator layer, and A represents an arbitrary positive integer.

When the thickness of the buried insulator layer of the SOI wafer is designed as a thickness d satisfying an expression $d=(1/2)\times(\lambda/n)\times A$, wherein d represents the thickness of the buried insulator layer, n represents a refractive index of the buried insulator layer, and A represents an arbitrary positive integer as above, the thickness of the buried insulator layer of the SOI wafer can be concretely designed on the basis of the wavelength $\lambda$ of the exposure light utilized for the photolithography operation, and the SOI wafer can be manufactured which enables inhibition of the variation in the reflection rate of the exposure light due to the variation in the SOI layer thickness and hence inhibition of the variation in the exposure state of the resist when the photolithography operation is performed on the SOI wafer.

In the manufacturing method, the buried insulator layer can be any one of a silicon oxide film, a silicon nitride film, and a silicon oxynitride film, or a laminated insulator layer formed as a multilayer thereof.

Even when various insulator films, such as any one of a silicon oxide film, a silicon nitride film, and a silicon oxynitride film, or a laminated insulator layer formed as a multilayer thereof, are used as the buried insulator layer, the SOI wafer can be manufactured which enables inhibition of the variation in the reflection rate of the exposure light due to the variation in the SOI layer thickness and hence inhibition of the variation in the exposure state of the resist in the photolithography operation in accordance with the present invention.

In the inventive method for manufacturing an SOI wafer that has an SOI layer formed on a buried insulator layer and is suitable for photolithography with an exposure light having a wavelength $\lambda$, at least the steps of: designing the thickness of the buried insulator layer of the SOI wafer on the basis of the wavelength $\lambda$ of the exposure light utilized for the photolithography operation that is to be performed on the SOI wafer after manufacturing; and fabricating the SOI wafer that has the SOI layer formed on the buried insulator layer having the designed thickness are included. The method can therefore manufacture the SOI wafer which enables inhibition of the variation in the reflection rate of the exposure light due to the variation in the SOI layer thickness and hence inhibition of the variation in the exposure state of the resist when the photolithography operation is performed on the SOI wafer and enables pattern formation with high precision. In addition, the reflection rate of the light to which the SOI wafer manufactured by the present invention is exposed can be made to be equivalent to that in the case of a bulk silicon (a silicon single crystal). The present invention thus has also an advantage in that photolithography conditions (the thickness of the resist, the thickness of a film for preventing reflection, exposure conditions and so on) for the bulk silicon can be used without alteration.

DESCRIPTION OF EMBODIMENTS

Hereinafter, embodiments of the present invention will be described, but the present invention is not limited to these embodiments.

Conventionally, in the photolithography operation in a device fabrication process, there has been a problem in that the reflection rate of the exposure light varies widely due to the variation in the SOI layer thickness in a plane of the SOI wafer and the intensity of exposure to the resist thereby varies so that unevenness of exposure is created. As a result, a difference in the developed resist pattern from the corresponding designed pattern may be created and a difference from design may also be created in pattern formation of the SOI wafer, which is performed by subsequent steps such as etching, film formation, and ion implantation, thereby resulting in variation in device electric characteristics.

In view of this, the present inventor repeatedly and keenly conducted studies to solve the problem. The present inventor focused attention on the wavelength of the exposure light and the thickness of the buried insulator layer and simulated the relation between the SOI layer thickness and the reflection rate of the exposure light when the wavelength of the exposure light and the buried insulator layer thickness are changed.

Figure 1:
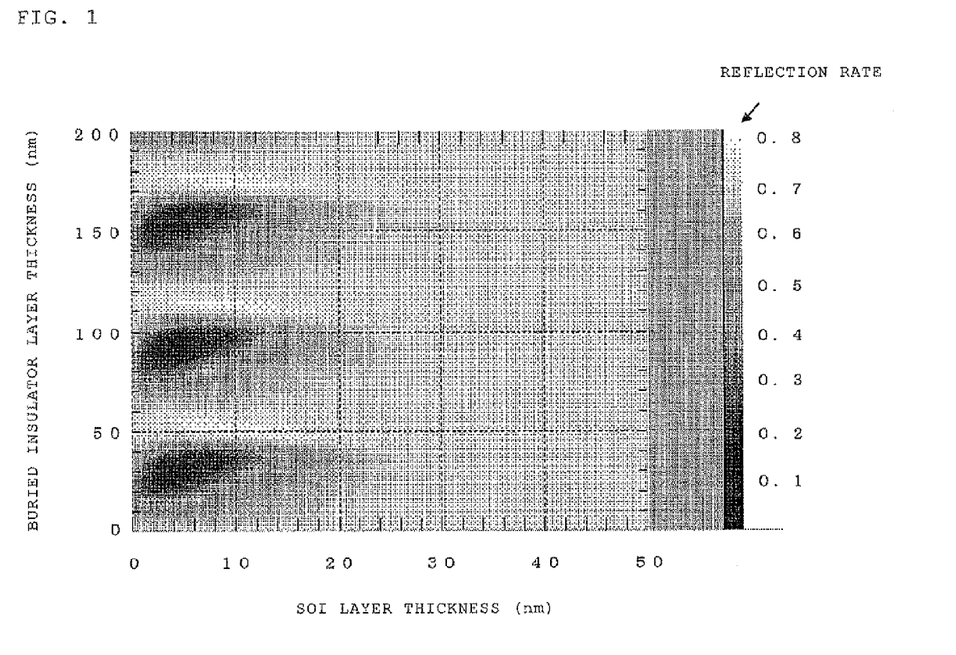
FIG. 1 is a diagram showing the result of a simulation of a relation among the SOI layer thickness, the buried insulator layer thickness, and the reflection rate in the case of a wavelength of 193 nm.

FIG. 1 shows the result of the simulation of the relation between the reflection rate of the exposure light and the SOI layer thickness when SOI wafers each having a different buried insulator layer thickness are exposed to an ArF laser having a wavelength $\lambda$ of 193 nm. The variation in the reflection rate is represented by a shade of color in FIG. 1 and a color closer to white exhibits a higher reflection rate.

It can be seen from the relation among the buried insulator layer thickness, the SOI layer thickness, and the reflection rate in FIG. 1 that the reflection rate does not vary (the color exhibiting the reflection rate does not vary) with respect to the variation in the SOI layer thickness when the buried insulator layer thickness is approximately 62 nm, 124 nm, and 186 nm.

Figure 5:
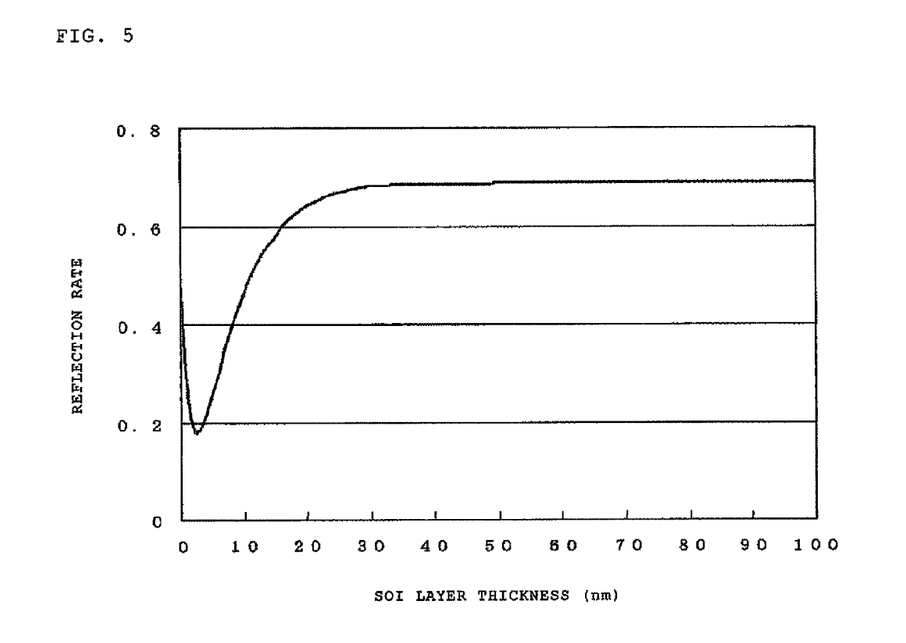
FIG. 5 is a diagram showing the result of measurement of the reflection rate with respect to the variation in the SOI layer thickness when being exposed to an ArF laser having a wavelength of 193 nm.

FIG. 5 shows the result of measurement of the reflection rate with respect to the variation in the SOI layer thickness when an SOI wafer having a buried insulator layer thickness of 145 nm is exposed to the ArF laser having a wavelength of 193 nm.

As shown in FIG. 5, when the SOI layer thickness is equal to or less than 30 nm, the reflection rate varies widely due to the variation in the SOI layer thickness. When the photolithography operation is performed with the ArF laser on an SOI wafer having a SOI layer thickness of 30 nm or less, the exposure state of a photoresist applied to the surface of the SOI wafer therefore varies according to a position in a plane of the SOI layer when there is thickness distribution in the plane of the SOI layer, and this causes the difference in the developed resist pattern after exposure from the designed pattern. As a result, the variation in characteristics of devices being fabricated is induced.

The present inventor thought on the basis of these results that selecting a film thickness that is properly designed for the wavelength $\lambda$ of the exposure light utilized for resist exposure in the photolithography operation as the thickness of the buried insulator layer of the SOI wafer enables the variation in the reflection rate to be avoided even though the SOI layer thickness varies. The present inventor further conducted simulations and experiments in various conditions and carefully examined them, thereby bringing the present invention to completion.

Figure 10:
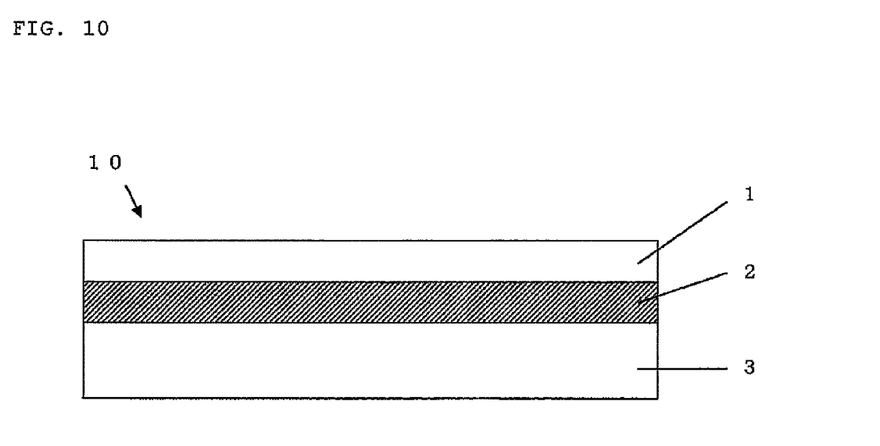
FIG. 10 is a schematic view showing an example of an SOI wafer being designed and manufactured by the method for designing and manufacturing an SOI wafer of the present invention.

FIG. 10 shows a schematic view of an example of the SOI wafer being designed and manufactured by the method for designing an SOI wafer and the method for manufacturing an SOI wafer of the present invention. As shown in FIG. 10, in the SOI wafer 10, the SOI layer 1 is formed on the buried insulator layer 2 on the base wafer 3, which is a supporting substrate.

A wavelength in the range from the visible light region to the DUV region is used as the wavelength of the exposure light utilized for the photolithography operation being performed on the SOI wafer 10. The wavelength is appropriately determined according to the feature size on the SOI wafer 10 and so on.

In the method for designing an SOI wafer of the present invention, the thickness of the buried insulator layer of the SOI wafer is designed on the basis of the wavelength $\lambda$ of the exposure light such that the variation in the reflection rate of the exposure light due to the variation in the SOI layer thickness is inhibited to design an SOI wafer suitable for the photolithography with the exposure light having the wavelength $\lambda$.

More specifically, the buried insulator layer thickness can be designed as a thickness d satisfying an expression $d=(\frac{1}{2})\times(\lambda/n)\times A$, wherein d represents the thickness of the buried insulator layer, n represents the refractive index of the buried insulator layer, and A represents an arbitrary positive integer.

Designing the thickness of the buried insulator layer of the SOI wafer in this manner realizes design of the SOI wafer that enables inhibit of the variation in the reflection rate of the exposure light due to the variation in the SOI layer thickness and hence inhibit of the variation in the exposure state of the resist when the photolithography operation is performed on the SOI wafer and enables pattern formation with high precision.

The results of the simulations of the relation between the SOI layer thickness and the reflection rate of the exposure light with respect to the buried insulator layer thickness when the SOI wafers were exposed to the exposure light having a wavelength are given in FIGS. 1 to 4 and Table 1. In the simulations conducted herein, silicon wafers were used as the base wafers, silicon oxide films were used as the buried insulator layers. The refractive indexes of the buried insulator layers were given in Table 1.

As described above, FIG. 1 shows the simulation result when the ArF laser having a wavelength $\lambda$ of 193 nm was used. As shown in FIG. 1, the variation in the reflection rate with respect to the variation in the SOI layer thickness is substantially eliminated when the buried insulator layer thickness is approximately a positive multiple of 62 nm. Here, the positive multiple of 62 nm is equal to a value obtained by the expression $(\frac{1}{2})\times(\lambda/n)\times A$.

Figure 2:
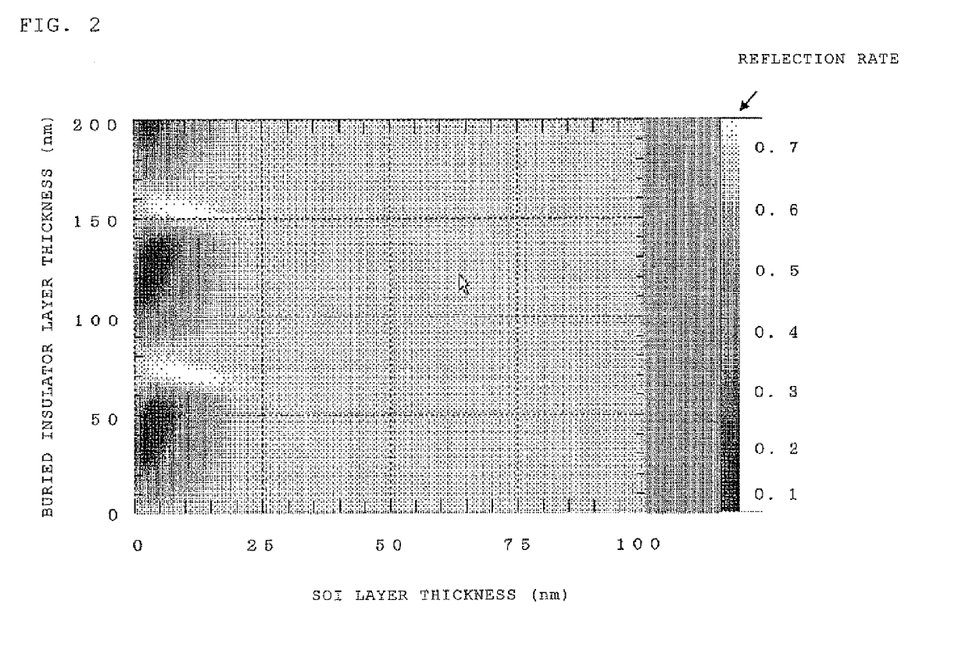
FIG. 2 is a diagram showing the result of a simulation of a relation among the SOI layer thickness, the buried insulator layer thickness, and the reflection rate in the case of a wavelength of 248 nm.

FIG. 2 shows the simulation result when a KrF laser having a wavelength λ of 248 nm was used. As shown in FIG. 2, the variation in the reflection rate with respect to the variation in the SOI layer thickness is substantially eliminated when the buried insulator layer thickness is approximately a positive multiple of 82.2 nm.

Figure 3:
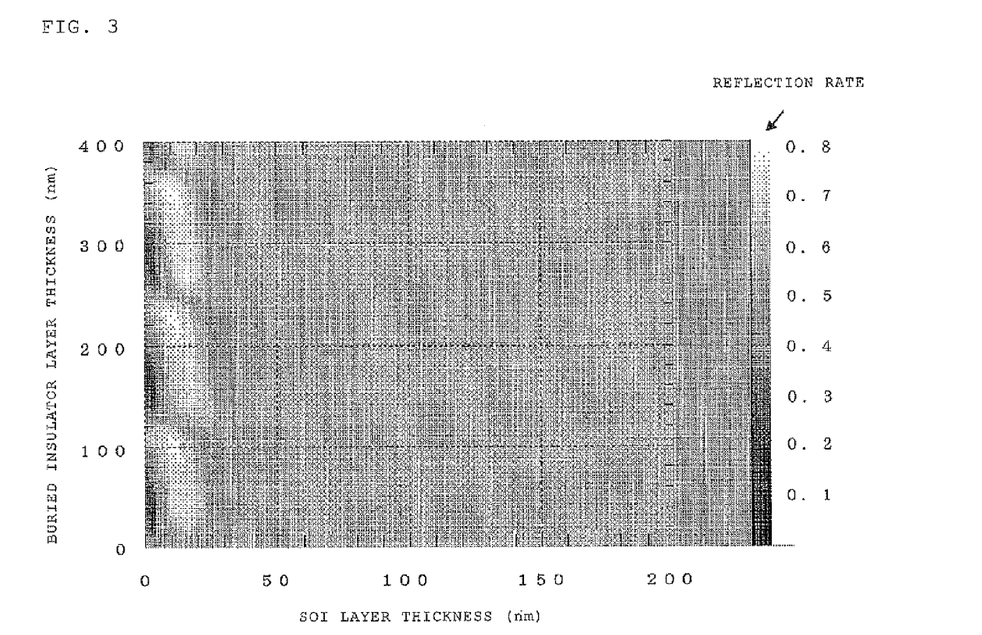
FIG. 3 is a diagram showing the result of a simulation of a relation among the SOI layer thickness, the buried insulator layer thickness, and the reflection rate in the case of a wavelength of 365 nm.

FIG. 3 shows the simulation result when i-line of a mercury lamp having a wavelength λ of 365 nm was used. As shown in FIG. 3, the variation in the reflection rate with respect to the variation in the SOI layer thickness is substantially eliminated when the buried insulator layer thickness is approximately a positive multiple of 123.8 nm.

Figure 4:
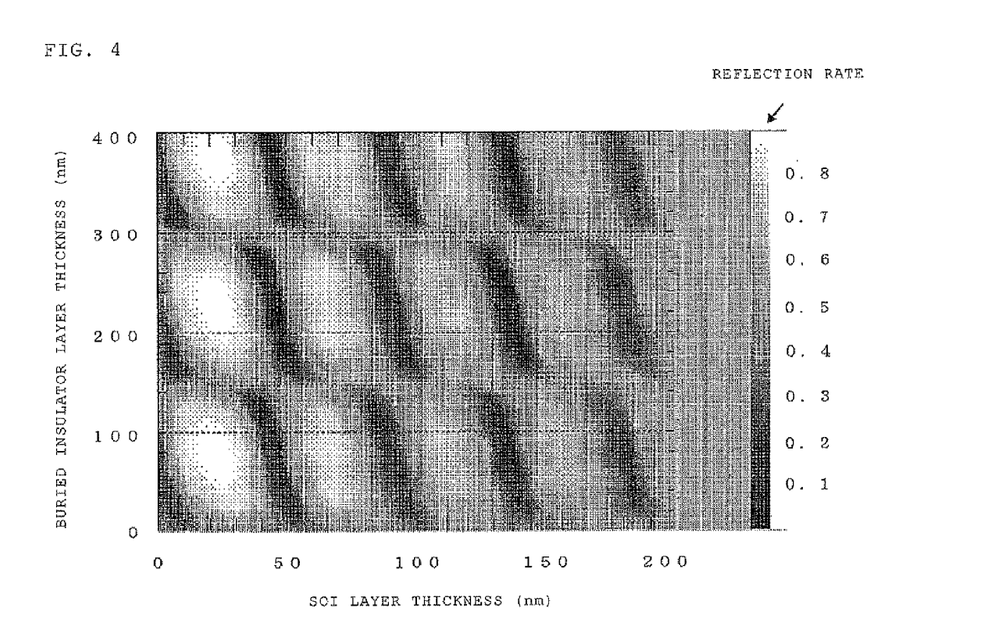
FIG. 4 is a diagram showing the result of a simulation of a relation among the SOI layer thickness, the buried insulator layer thickness, and the reflection rate in the case of a wavelength of 436 nm.

FIG. 4 shows the simulation result when g-line of a mercury lamp having a wavelength λ of 436 nm was used. As shown in FIG. 4, the variation in the reflection rate with respect to the variation in the SOI layer thickness is substantially eliminated when the buried insulator layer thickness is approximately a positive multiple of 148.6 nm.

When using EUV having a wavelength λ of 13.5 nm (not shown), the variation in the reflection rate with respect to the variation in the SOI layer thickness was substantially eliminated when the buried insulator layer thickness was approximately a positive multiple of 6.9 nm.

Table 1 summarizes the above results. As shown in the results, designing the buried insulator layer thickness d so as to satisfy the expression $d=(1/2)\times(\lambda/n)\times A$ ensures a constant reflection rate of the exposure light without being affected by the variation in the SOI layer thickness, and the constant reflection rate can be made to be equivalent to a reflection rate in a state where the buried insulator layer thickness is zero, i.e., in a state where a bulk silicon is used.

SOI layer thickness can be inhibited in the photolithography operation and the variation in the exposure state of the resist can be thereby inhibited, even when various buried insulator layers are used as described above.

Next, the method for manufacturing an SOI wafer of the present invention will be described.

First, the thickness of the buried insulator layer of the SOI wafer is designed on the basis of the wavelength λ of the exposure light utilized for photolithography that is to be performed on the SOI wafer after manufacturing such that the variation in the reflection rate of the exposure light due to the variation in the SOI layer thickness is inhibited, in the same manner as the above-described method for designing an SOI wafer of the present invention.

More specifically, the buried insulator layer thickness can be designed as a thickness d satisfying the expression $d=(1/2)\times(\lambda/n)\times A$, wherein d represents the thickness of the buried insulator layer, n represents the refractive index of the buried insulator layer, and A represents an arbitrary positive integer.

Next, the SOI wafer 10 having the SOI layer 1 formed on the buried insulator layer 2 on the base wafer 3, which is a supporting substrate, is fabricated as shown in FIG. 10. In the fabrication, the thickness of the buried insulator layer 2 is the designed thickness.

The SOI wafer 10 can be fabricated, for example, by the bonding method in which two silicon single crystal wafers are prepared for the base wafer 3 and the bond wafer, the buried insulator layer 2 having the above designed thickness is formed on at least one of the wafers, the base wafer 3 is bonded to the bond wafer, and the bond wafer is thinned.

TABLE 1

|  | SIMULATION 1 | SIMULATION 2 | SIMULATION 3 | SIMULATION 4 | SIMULATION 5 |
| --- | --- | --- | --- | --- | --- |
| WAVELENGTH λ OF EXPOSURE LIGHT (nm) | 193 | 248 | 365 | 436 | 13.5 |
| REFRACTIVE INDEX OF BURIED INSULATOR LAYER | 1.5628 | 1.5086 | 1.4746 | 1.4667 | 0.9765 |
| λ/2n | 62 | 82.2 | 123.8 | 148.6 | 6.9 |

In the method, the buried insulator layer can be any one of a silicon oxide film, a silicon nitride film, and a silicon oxynitride film, or a laminated insulator layer formed as a multilayer thereof.

When the buried insulator layer is the silicon nitride film or silicon oxynitride film as above, the buried insulator layer thickness may be designed by using the refractive index of the buried insulator layer as well as the silicon oxide film.

In the case of the laminated insulator layer formed of a plurality of buried insulator layers, the thicknesses of the buried insulator layers may be each designed such that the product ($d \times n$) of the buried insulator layer thickness and its refractive index is calculated at each buried insulator layer in the laminated insulator layer and the sum of the products of all layers satisfies the expression $(1/2)\times\lambda\times A$. For example, when the laminated insulator layer has two layers, it may be designed so as to satisfy an expression $d1\times n1+d2\times n2=(1/2)\times\lambda\times A$, wherein d1 and n1 represent the thickness and refractive index of a first buried insulator layer respectively and d2 and n2 represent the thickness and refractive index of a second buried insulator layer respectively.

The present invention realizes design of a suitable SOI wafer for photolithography by which the variation in the reflection rate of the exposure light due to the variation in the The thinning step for forming the SOI layer 1 of the SOI wafer 10 can be performed by grinding and polishing, or the ion implantation delamination method. The ion implantation delamination method is a technique for obtaining an SOI wafer, for example, as follows: a silicon oxide film is formed on at least one of two silicon single crystal wafers; at least one of hydrogen ions and rare gas ions are implanted from the surface of one of the wafers (the bond wafer) to form a micro bubble layer (an enclosed layer) at the close vicinity of the surface in the interior of the wafer; the ion-implanted surface of the bond wafer is then brought into close contact with the other wafer (the base wafer) through the silicon oxide film; a heat treatment (a delamination heat treatment) is then performed to delaminate the bond wafer as a thin film such that the micro bubble layer becomes a cleavage plane (a delaminated plane); and a heat treatment (a bonding heat treatment) is further performed to firmly bond the two silicon single crystal wafers together. An SOI wafer having a thin SOI layer with very high thickness uniformity can be obtained with relative ease by the ion implantation delamination method.

The ion implantation delamination method enables easy and highly accurate control of the thickness of the SOI layer and the BOX layer and is particularly preferable to be used in the method for manufacturing an SOI wafer of the present invention.

Various heat treatments may be then applied according to the SOI wafer being fabricated.

Manufacturing the SOI wafer in this manner realizes manufacture of the suitable SOI wafer for photolithography that enables inhibition of the variation in the reflection rate of the exposure light due to the variation in the SOI layer thickness and hence inhibition of the variation in the exposure state of the resist when the photolithography operation is performed on the SOI wafer and enables pattern formation with high precision. As a result, variation in device patterns formed by developing after exposure in the photolithography operation or by subsequent processes (e.g., etching, film formation, and ion implantation) can be substantially eliminated, thereby achieving device patterns as designed.

Moreover, since the reflection rate can be made to be equivalent to a reflection rate in a state where a bulk silicon (or a bulk silicon on which a film identical to that formed on the SOI surface is formed) is used, photolithography conditions such as thickness design of a film used in the photolithography operation, e.g., a resist film, a film for preventing reflection, and a topcoat film (in the case of immersion photolithography) can be identical to those used for the bulk silicon, and this enables simplification of the photolithography.

In the method, the buried insulator layer can be any one of a silicon oxide film, a silicon nitride film, and a silicon oxynitride film, or a laminated insulator layer formed as a multi-layer thereof.

When the buried insulator layer is the silicon nitride film or silicon oxynitride film, the buried insulator layer thickness may be designed by using the refractive index of the buried insulator layer as well as the silicon oxide film.

As described above, in the case of the laminated insulator layer formed of a plurality of buried insulator layers, the thicknesses of the buried insulator layers may be each designed such that the product ($d \times n$) of the buried insulator layer thickness and its refractive index is calculated at each buried insulator layer in the laminated insulator layer and the sum of the products of all layers satisfies the expression $(\frac{1}{2}) \times \lambda \times A$.

The present invention realizes manufacture of the suitable SOI wafer for photolithography by which the variation in the reflection rate of the exposure light due to the variation in the SOI layer thickness can be inhibited in the photolithography operation and the variation in the exposure state of the resist can be thereby inhibited, even when various buried insulator layers are used as described above.

In the embodiments described above, the silicon oxide film, the silicon nitride film, and the silicon oxynitride film are exemplified as the buried insulator layer 2. In the present invention, however, insulator films made of high permittivity materials (high-k films) such as $HfO_2$, $ZrO_2$, $La_2O_3$, and $TiO_2$ can also be employed.

EXAMPLE

The present invention will be more specifically described below with reference to Examples and Comparative Examples, but the present invention is not limited these examples.

Example 1

An SOI wafer suitable for photolithography with an exposure light having a wavelength $\lambda$ was manufactured by the method for designing an SOI wafer and the method for manufacturing an SOI wafer of the present invention. The reflection rate with respect to the variation in the SOI layer thickness was evaluated when the manufactured SOI wafer was exposed to the exposure light having the wavelength $\lambda$. In Example 1, the wavelength $\lambda$ of the exposure light was 193 nm, and the buried insulator layer thickness designed on the basis of the wavelength $\lambda$ was 124 nm (See Table 1).

Figure 6:
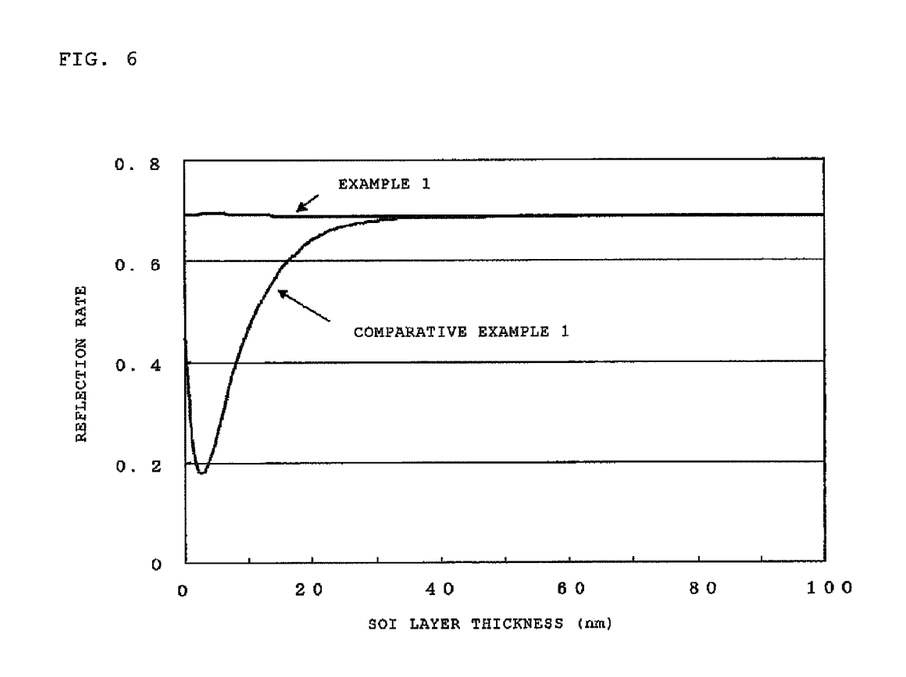
FIG. 6 is a diagram showing the results of Example 1 and Comparative Example 1.

The evaluation result is given in FIG. 6. Referring to FIG. 6, it can be seen that the reflection rate with respect to the variation in the SOI layer thickness did not vary but stayed constant. On the other hand, it can be seen that, in the later-described Comparative Example 1, the reflection rate with respect to the variation in the SOI layer thickness varied widely.

It can be accordingly confirmed that the method for designing an SOI wafer and the method for manufacturing an SOI wafer of the present invention realize design and manufacture of the suitable SOI wafer for photolithography, and when the SOI wafer designed and manufactured by the invention is used in the photolithography operation, the variation in the reflection rate of the exposure light due to the variation in the SOI layer thickness can be inhibited and the variation in the exposure state of the resist can be thereby inhibited. The SOI wafer also enables pattern formation with high precision.

Examples 2 to 4

The conditions of the wavelength $\lambda$ of the exposure light and the buried insulator layer thickness designed on the basis of the wavelength $\lambda$ in Example 1 were changed to evaluate the reflection rate in the same manner as in Example 1 (See Table 1). In Example 2, the wavelength $\lambda$ was 248 nm and the buried insulator layer thickness was 164.5 nm. In Example 3, the wavelength $\lambda$ was 365 nm and the buried insulator layer thickness was 123.8 nm. In Example 4, the wavelength $\lambda$ was 436 nm and the buried insulator layer thickness was 148.6 nm.

Figure 7:
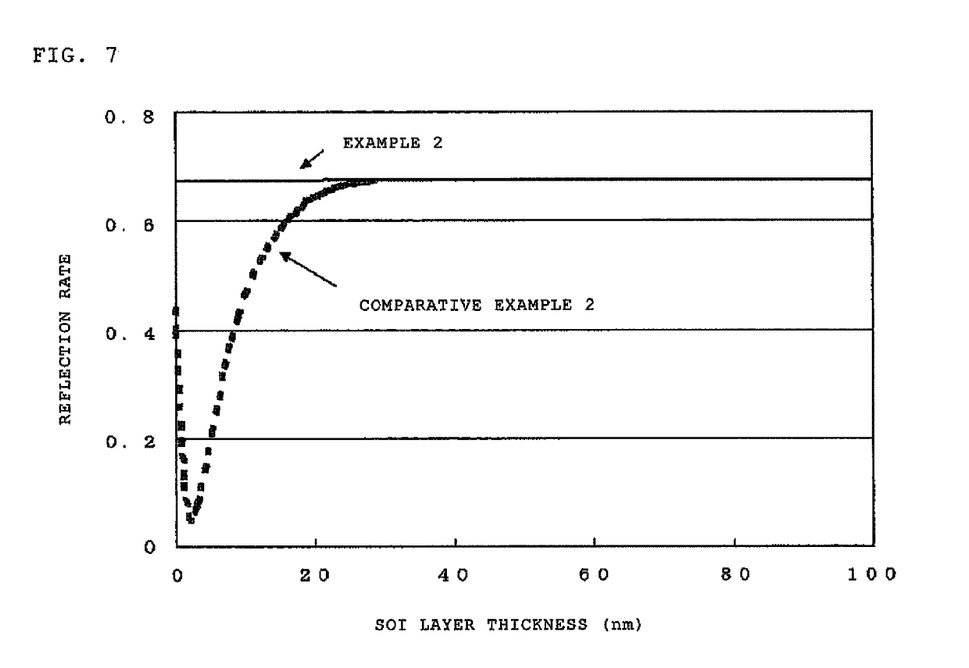
FIG. 7 is a diagram showing the results of Example 2 and Comparative Example 2.
Figure 8:
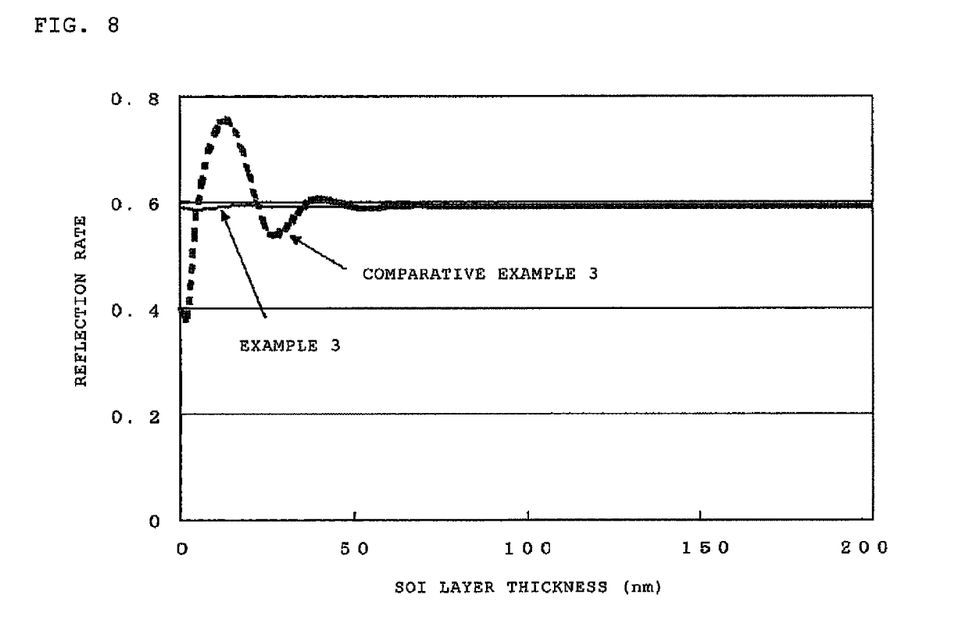
FIG. 8 is a diagram showing the results of Example 3 and Comparative Example 3.
Figure 9:
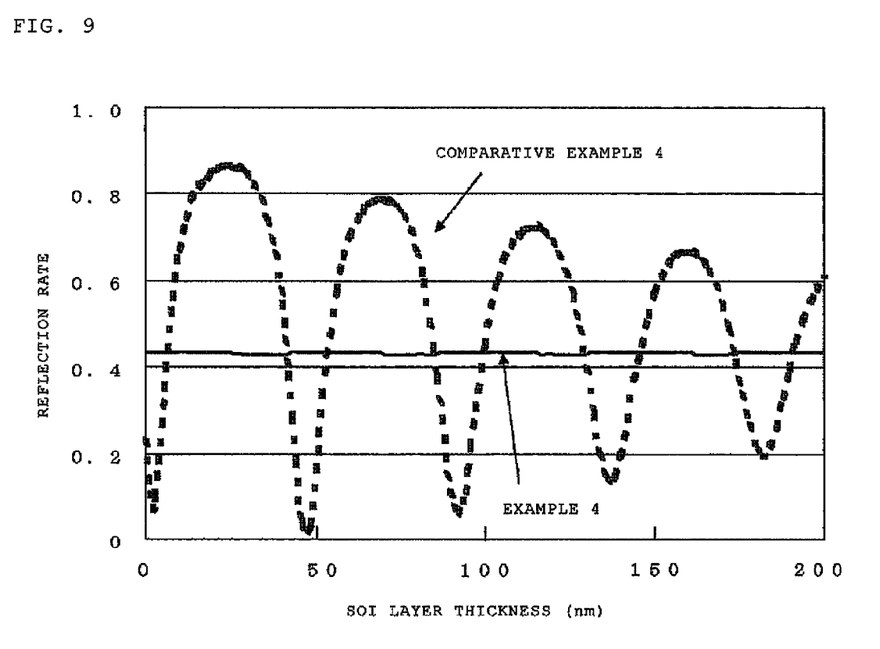
FIG. 9 is a diagram showing the results of Example 4 and Comparative Example 4.

The evaluation results are given in FIGS. 7 to 9. Referring to FIGS. 7 to 9, in all of these examples, the reflection rate with respect to the variation in the SOI layer thickness did not vary but stayed constant. The results exhibited the same tendency as Example 1.

Comparative Examples 1 to 4

An SOI wafer was manufactured in the same manner as Examples 1 to 4 except that the buried insulator layer thickness d was designed to be a thickness not satisfying the expression $d=(\frac{1}{2}) \times (\lambda/n) \times A$, and the reflection rate was evaluated in the same manner as Example 1. In Comparative Example 1, the buried insulator layer thickness was 145 nm. In Comparative Examples 2 to 4, the buried insulator layer thickness was 200 nm.

The results are given in FIGS. 6 to 9. Referring to FIGS. 6 to 9, it can be seen that, in Comparative Examples 1 to 4, the reflection rate with respect to the variation in the SOI layer thickness varied widely.

Therefore, when the photolithography operation is performed on the SOI wafer having the buried insulator layer thickness not satisfying $(\frac{1}{2}) \times (\lambda/n) \times A$, the exposure state of the photoresist applied to the surface of the SOI wafer varies according to a position in a plane of the SOI layer when there is thickness distribution in the plane of the SOI layer, and this causes the difference in the developed resist pattern after exposure from the design pattern.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for designing an SOI wafer that has an SOI layer formed on a buried insulator layer and is suitable for photolithography with an exposure light having a wavelength $\lambda$, the method comprising:

determining a thickness of the buried insulator layer of the SOI wafer with a processor, on the basis of the wavelength $\lambda$ of the exposure light, by an expression $d=(\frac{1}{2})\times(\lambda/n)\times A$, wherein d represents the thickness of the buried insulator layer, n represents a refractive index of the buried insulator layer, and A represents an arbitrary positive integer.

2. The method for designing an SOI wafer according to claim 1, wherein the buried insulator layer is any one of a silicon oxide film, a silicon nitride film, and a silicon oxynitride film, or a laminated insulator layer formed as a multilayer thereof.

3. A method for manufacturing an SOI wafer that has an SOI layer formed on a buried insulator layer and is suitable for photolithography with an exposure light having a wavelength $\lambda$, the method comprising the steps of:

determining a thickness of the buried insulator layer of the SOI wafer with a processor, on the basis of the wavelength $\lambda$ of the exposure light utilized for the photolithography that is to be performed on the SOI wafer after manufacturing, by an expression $d=(\frac{1}{2})\times(\lambda/n)\times A$, wherein d represents the thickness of the buried insulator layer, n represents a refractive index of the buried insulator layer, and A represents an arbitrary positive integer; and fabricating the SOI wafer that has the SOI layer formed on the buried insulator layer having the determined thickness.

4. The method for manufacturing an SOI wafer according to claim 3, wherein the buried insulator layer is any one of a silicon oxide film, a silicon nitride film, and a silicon oxynitride film, or a laminated insulator layer formed as a multilayer thereof.

* * * * *